(12) United States Patent
Babiarz et al.

(10) Patent No.: US 8,796,075 B2
(45) Date of Patent: Aug. 5, 2014

(54) METHODS FOR VACUUM ASSISTED UNDERFILLING

(75) Inventors: Alec Babiarz, Encinitas, CA (US); Horatio Quinones, San Marcos, CA (US); Thomas L. Ratledge, San Marcos, CA (US)

(73) Assignee: Nordson Corporation, Westlake, OH (US)

( * ) Notice: Subject to any disclaimer, the term of this patent is extended or adjusted under 35 U.S.C. 154(b) by 0 days.

(21) Appl. No.: 13/548,965

(22) Filed: Jul. 13, 2012

(65) Prior Publication Data

US 2012/0295405 A1 Nov. 22, 2012

Related U.S. Application Data

(63) Continuation-in-part of application No. 13/004,198, filed on Jan. 11, 2011, now abandoned.

(51) Int. Cl.
*H01L 21/00* (2006.01)

(52) U.S. Cl.
USPC ............ 438/118; 438/127; 438/108; 257/778

(58) Field of Classification Search
USPC .......... 257/778, E21.503, 774; 438/127, 108, 438/51, 118, 120, 126, 119, 106
See application file for complete search history.

(56) References Cited

U.S. PATENT DOCUMENTS

| | | | |
|---|---|---|---|
| 5,710,071 A | 1/1998 | Beddingfield et al. | |
| 5,817,545 A | 10/1998 | Wang et al. | |
| 5,834,339 A | 11/1998 | Distefano et al. | |
| 5,942,798 A | 8/1999 | Chiu | |
| 5,998,242 A | 12/1999 | Kirkpatrick et al. | |
| 6,048,656 A * | 4/2000 | Akram et al. | 438/118 |
| 6,107,123 A | 8/2000 | Distefano et al. | |
| 6,166,434 A | 12/2000 | Desai et al. | |
| 6,228,679 B1 | 5/2001 | Chiu | |
| 6,255,142 B1 | 7/2001 | Babiarz et al. | |
| 6,284,173 B1 | 9/2001 | Austin et al. | |

(Continued)

FOREIGN PATENT DOCUMENTS

| | | |
|---|---|---|
| EP | 1443547 A2 | 8/2004 |
| JP | 2011171426 A | 9/2011 |
| WO | 03006230 | 1/2003 |

OTHER PUBLICATIONS

International Preliminary Examining Authority, International Preliminary Report on Patentability issued in related International application No. PCT/US11/64373 dated Dec. 18, 2012.

(Continued)

*Primary Examiner* — Jarrett Stark
*Assistant Examiner* — Shahed Ahmed
(74) *Attorney, Agent, or Firm* — Wood, Herron & Evans, LLP

(57) ABSTRACT

Methods for applying an underfill with vacuum assistance. The method may include dispensing the underfill onto a substrate proximate to at least one exterior edge of an electronic device attached to the substrate. A space between the electronic device and the substrate is evacuated through at least one gap in the underfill. The method further includes heating the underfill to cause the underfill to flow into the space. Because a vacuum condition is supplied in the open portion of the space before flow is initiated, the incidence of underfill voiding is lowered.

6 Claims, 8 Drawing Sheets

(56) References Cited

U.S. PATENT DOCUMENTS

| | | | |
|---|---|---|---|
| 6,338,981 | B1 | 1/2002 | Klocke et al. |
| 6,352,423 | B1 | 3/2002 | Babiarz et al. |
| 6,373,142 | B1 | 4/2002 | Hoang |
| 6,376,918 | B1 * | 4/2002 | Akram et al. ............ 257/778 |
| 6,413,576 | B1 | 7/2002 | Ellis et al. |
| 6,436,331 | B1 | 8/2002 | Kuno et al. |
| 6,521,481 | B1 | 2/2003 | Chen et al. |
| 6,537,859 | B2 | 3/2003 | Mitsumune |
| 6,703,299 | B2 | 3/2004 | Shi et al. |
| 6,800,946 | B2 | 10/2004 | Chason et al. |
| 6,861,278 | B2 | 3/2005 | Quinones et al. |
| 6,933,614 | B2 | 8/2005 | Lee et al. |
| 7,060,528 | B2 | 6/2006 | Nishikawa et al. |
| 7,183,139 | B2 | 2/2007 | Jayaraman et al. |
| 7,470,564 | B2 | 12/2008 | Shi et al. |
| 2002/0060368 | A1 * | 5/2002 | Jiang ............ 257/778 |
| 2002/0162679 | A1 | 11/2002 | Hannan et al. |
| 2003/0096453 | A1 * | 5/2003 | Wang et al. ............ 438/108 |
| 2004/0161528 | A1 | 8/2004 | Martinez et al. |
| 2004/0214370 | A1 | 10/2004 | Quinones et al. |
| 2007/0090532 | A1 | 4/2007 | Lehman |
| 2007/0117264 | A1 | 5/2007 | Masumoto |
| 2009/0099512 | A1 | 4/2009 | DiGregorio et al. |
| 2009/0179333 | A1 | 7/2009 | Martin et al. |
| 2009/0230409 | A1 | 9/2009 | Basin et al. |
| 2009/0288773 | A1 | 11/2009 | Bolden, II et al. |
| 2010/0102107 | A1 | 4/2010 | Kopp et al. |
| 2010/0194505 | A1 | 8/2010 | Brass et al. |
| 2012/0098091 | A1 * | 4/2012 | Ikemoto et al. ............ 257/532 |
| 2012/0299174 | A1 * | 11/2012 | Choi et al. ............ 257/692 |
| 2013/0029457 | A1 * | 1/2013 | Simmons-Matthews ..... 438/113 |
| 2013/0109136 | A1 * | 5/2013 | Foote et al. ............ 438/115 |

OTHER PUBLICATIONS

USPTO, Office Action issued in related U.S. Appl. No. 13/025,717 dated Jan. 9, 2012.

Antonijevic et al., "Copper Corrosion Inhibitors, a review", Int. J. Electrochemi. Soc., 3, pp. 1-28, 2008.

Lin et al., "Effect of Plasma Polymer Deposition methods on Copper Corrosion Protection", J. of Applied Polymer Science, vol. 60, pp. 543-555, 1996.

Grassine, et al., "Advanced plasma treatment for cleaning and protecting precious metal artifacts", International Conference on Strategies for Saving Indoor Metallic Collections with a Satellite Meeting on Legal Issues in the Conservation of Cultural Heritage, pp. 127-131, Cairo-Egypt, Feb. 25-Mar. 1, 2007.

David K. Foote, Methods of Fabricating Electronics Assemblies, U.S. Appl. No. 13/285,547, filed Oct. 31, 2011.

International Searching Authority, International Search Report and Written Opinion issued in related International application No. PCT/US11/64373 dated Jan. 13, 2012.

USPTO, Office Action issued in related U.S. Appl. No. 13/004,198 dated Oct. 24, 2011.

USPTO, Office Action issued in related U.S. Appl. No. 13/004,198 dated Apr. 4, 2012.

European Patent Office, International Search Report and Written Opinion issued in International application No. PCT/US2013/050180 dated Dec. 3, 2013.

European Patent Office, Invitation to Pay Additional Fees issued in International application No. PCT/US2013/050180 dated Sep. 27, 2013.

\* cited by examiner

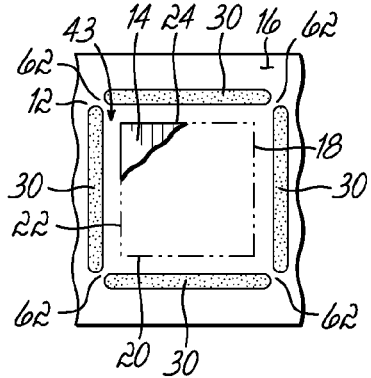 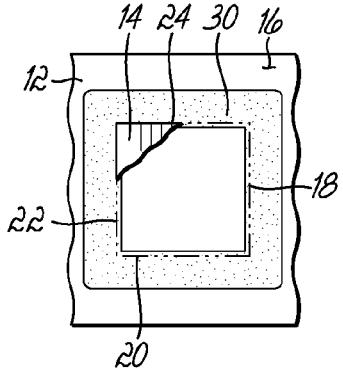 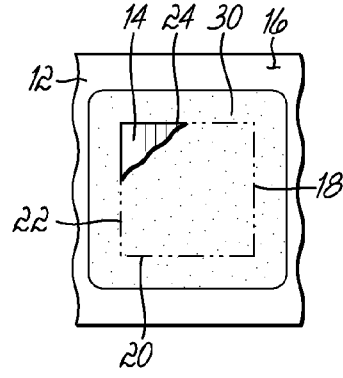
FIG. 5A  FIG. 5B  FIG. 5C
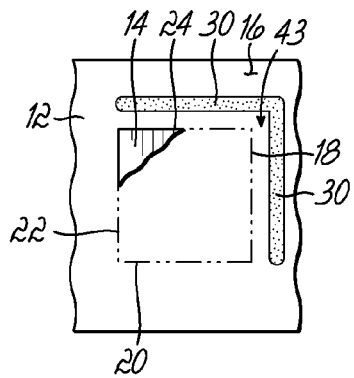 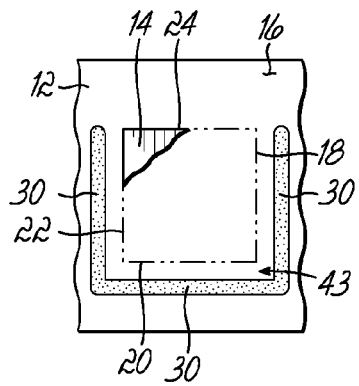
FIG. 5D  FIG. 5E
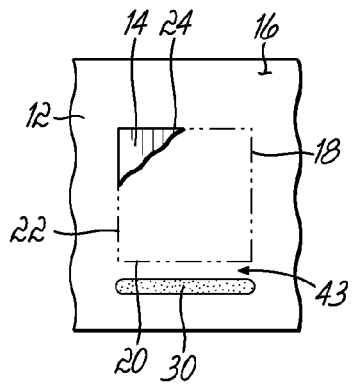 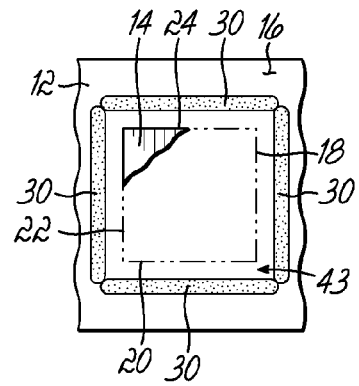
FIG. 5F  FIG. 5G

METHODS FOR VACUUM ASSISTED UNDERFILLING

CROSS-REFERENCE TO RELATED APPLICATION

This application is a continuation-in part application of U.S. patent application Ser. No. 13/004,198, filed Jan. 11, 2011, the disclosure of which is incorporated by reference herein in its entirety.

BACKGROUND

The invention relates generally to methods for applying an underfill between an electronic device and a substrate.

It is typical for an electronic device, such as a flip chip, chip scale package (CSP), ball grid array (BGA) or package on package assembly (PoP) to include a pattern of solder bumps that, during mounting, are registered with pads on a substrate, or joined using another type of interconnect technology such as copper pillars or other types of thermal compression bonding interconnects. The substrate can be a printed circuit board, electronic chip or wafer, for example. The solder is reflowed by heating and, following solidification, solder joints connect the electronic device and the substrate. Underfill, which may be an expoxy, may be used to fill the open space between the electronic device and the substrate that remains between the reflowed solder balls. The underfill protects the solder joints against various adverse environmental factors, redistributes mechanical stresses due to shock, and prevents the solder joints from moving under strain during thermal cycles.

In the process of underfilling, voids may be formed due to the following reasons, but not limited to, uneven surface topography in the gap between the electronic device and substrate, fluid flow rate race conditions as underfill flows around a solder connection, different wetability conditions on the substrate, air in the underfill, or air induced from the dispensing process. Because the voids are unfilled by underfill, unsupported solder joints adjacent to voids may not be adequately protected against cold flow when exposed to strain from thermal expansion during operation or to mechanical shock caused by dropping the assembled end product, such as a cell phone, that includes the underfilled electronic device. Voids at solder joints prevent the solder bump from being in held in a state of hydrostatic compression and strain restraint, which may increase solder joint fatigue and thereby increase the probability of solder joint cracking.

Therefore, improved methods are needed for applying an underfill that reduces the probability of forming voids in the underfill.

SUMMARY OF THE INVENTION

In one embodiment, a method is provided for distributing an underfill into the space between the reflowed solder balls which connect an electronic device to a substrate. The method includes providing the underfill onto the substrate near to at least one exterior edge of the electronic device with at least one gap in the underfill, providing an air path to the space between the electronic device and the substrate and then evacuating that space through the gap, or gaps, to provide a vacuum condition in the space. After evacuating the space, the underfill is heated above room temperature to cause capillary flow of the underfill to the exterior edge, or edges, and into the space between the electronic device and substrate and around the reflowed solder balls. The underfill can be provided as a material which is solid at room temperature and is positioned by pick and place equipment onto the substrate, and thereafter becomes liquid at elevated temperatures, or as a liquid material that can be dispensed onto the substrate by, for example, a valve or dispenser.

Another embodiment of the invention is directed to a method of providing an underfill on a substrate upon which electronic device is mounted by electrically conductive joints and is separated from the substrate by a space. The space has an open portion that is unoccupied by the conductive joints. The method includes providing the underfill onto the substrate proximate to at least one exterior edge of the electronic device, and evacuating the space to provide a vacuum condition in the open portion of the space between the underfill and external edges of the electronic device. After evacuating the space to a vacuum condition, the underfill is heated to a temperature above room temperature to cause flow of the underfill to at least one exterior edge and into the open portion of the space, thereby allowing any air trapped under the underfill itself to vent before reaching the external edge of the electrical device and the gap between the electrical device and substrate Other embodiments of the invention are directed to methods of blocking air that has been trapped under the underfill from flowing under the electronic device. In one such method, an obstacle is placed between the edge of the electronic device and the underfill prior to applying the vacuum. After applying the vacuum condition, the underfill is heated to a temperature above room temperature to cause flow of the underfill over the obstacle and from at least one exterior edge into the open portion of the space. Forcing the underfill to flow over an obstacle, helps block the air trapped under the underfill from flowing under the electronic device and allows the trapped air to vent prior to reaching the gap under the electrical device Yet another embodiment of the invention is directed to a method of exposing a surface of the substrate to a plasma so as to change the wettability of the substrate prior to providing the underfill onto the substrate proximate to at least one exterior edge of the electronic device. This plasma treatment reduces the opportunity for air to be trapped under the underfill. The method further includes evacuating the space to provide a vacuum condition, in the open portion of the space. After evacuating the space to a vacuum condition, the underfill is heated to cause flow of the underfill toward at least one exterior edge and into the open portion of the space. Since the plasma treatment of the substrate reduces the entrapment of air under the underfill, an amount of air trapped under the electronic device during the underfill operation may also be reduced.

Similar to the plasma treatment method, a glass-like film may be deposited on the substrate so as to provide a more perfectly smooth and flat surface. This flat surface has fewer depressions or imperfections in which air can be trapped when the underfill is positioned on top of the glass-like film. As entrapment of air under the underfill is reduced, an amount of air trapped under the electronic device during the underfill operation may also be reduced.

BRIEF DESCRIPTION OF THE DRAWINGS

The accompanying drawings, which are incorporated in and constitute a part of this specification, illustrate exemplary embodiments of the invention and, together with a general description of embodiments of the invention given above, and the detailed description given below, serve to explain the principles of the embodiments of the invention.

FIGS. 5A-C are diagrammatic top views similar to FIGS. 3A-C in accordance with yet another embodiment of the invention.

FIGS. 5D, 5E and 5F are diagrammatic top views similar to FIG. 5A in which the underfill is provided on the substrate with, respectively, an L pattern, a U pattern, and an I pattern.

FIG. 5G is a diagrammatic top view similar to FIG. 5A in which the underfill is provided on the substrate with no gaps.

DETAILED DESCRIPTION

Generally, the embodiments of the invention are directed to a vacuum-assisted process for underfilling an electronic device mounted on a substrate by an array of solder balls. Underfill is dispensed or otherwise provided (e.g., in either a liquid or solid form) in one or more lines around the edges of an unheated electronic device, which is mounted to an unheated substrate by means of an array of reflowed solder balls. Preferably, at least one gap is left in the one or more lines of underfill and, preferably, if the space between the electronic device and substrate is very small, there is a space between the underfill and the exterior edges of the electrical device. The substrate is transported into a vacuum chamber, before significant capillary underfilling (and air or gas entrapment) occurs, and a vacuum is applied to evacuate the space. While the vacuum is being applied, the gap, or gaps, in the one or more lines of underfill allows air to flow out from under the device through the gap(s), to establish a vacuum condition (i.e., a pressure less than atmospheric pressure) under the electronic device between the electronic device and the substrate. An alternative, less preferred process, is to provide no gap in the underfill and to rely upon the air trapped under the device to bubble through the underfill when the device is placed under vacuum. Under either process, while the vacuum condition is being maintained, the electronic device and substrate are heated to cause the underfill to completely flow under the electronic device into the spaces between the reflowed solder balls. Underfilling in the presence of the vacuum condition means any void entrapped in the underfill will be partially evacuated of gases commensurate with the level of the applied vacuum. The vacuum pressure applied must not be lower than the vapor pressure of the underfill, otherwise the underfill will boil and the process will become less stable. The vacuum chamber is then vented. Any voids present in the underfill will now collapse because of the evacuated condition and become filled with underfill. The underfilled electronic device and the substrate are then moved out of the vacuum chamber.

The embodiments of the invention also apply to other interconnect technologies, in addition to solder bumps, for creating conductive joints between the electronic device and the substrate, such as copper pillars and other thermal compression bonding interconnect technologies.

Figure 1:
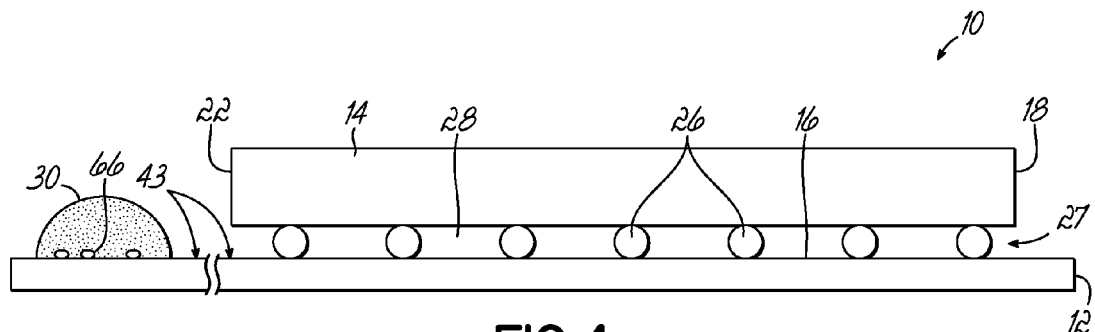
FIG. 1 is a side view of an electronic device mounted to a substrate by an array of solder balls and with underfill provided along a side edge of the electronic device.
Figure 3A:
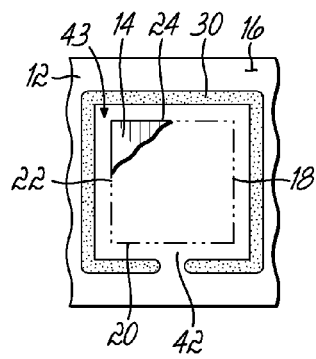
FIGS. 3A-C are diagrammatic top views illustrating a sequence for vacuum underfilling beneath an electronic device mounted on a substrate in accordance with an embodiment of the invention.
Figure 3B:
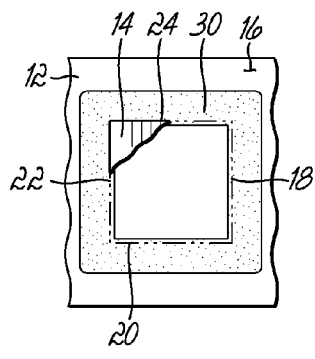

With reference to FIG. 1, an assembly 10 includes a substrate 12, such as a printed circuit board, and an electronic device 14 that is mounted to a surface 16 of the substrate 12. In representative embodiments, the electronic device 14 may be a flip chip, chip scale package (CSP), ball grid array (BGA) or package on package assembly (PoP), for example. Likewise, the substrate 12 may be a printed circuit board (PCB), electronic chip or wafer, for example, or any substrate or interposer used in semiconductor packaging of electronic devices With reference to FIGS. 1, 1A, and 3A, the electronic device 14 has a footprint on the substrate 12 such that the substrate 12 is exposed adjacent to each of the side or exterior edges 18, 20, 22, 24 of the electronic device 14. Solder joints 26 mechanically and electrically connect the electronic device 14 with the substrate 12. A space 28 is defined between the electronic device 14 and substrate 12 and a portion of the space 28 is open (i.e., unoccupied) and unfilled by the solder joints 26 that may have a representative form of solder balls. At each of the exterior edges 18, 20, 22, 24, a gap 27 is defined between the electronic device 14 and the substrate 12. The gap 27 communicates with the space 28. Preferably, for small gaps 24 (e.g., less than 200 microns), a space 43 on the surface of substrate 12 exists between the underfill 30 and corresponding device edges 18, 20, 22 and 24.

Figure 1A:
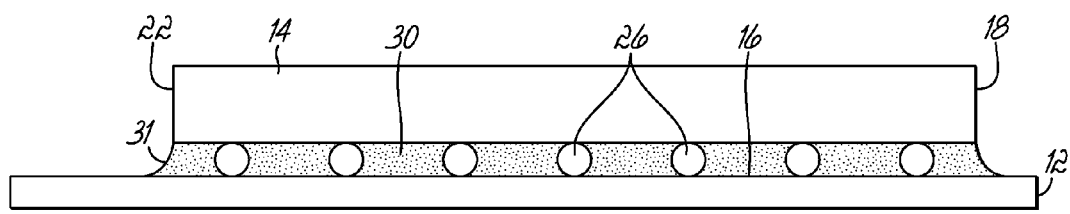
FIG. 1A is a side view similar to FIG. 1 in which the underfill has moved into the open space between the electronic device and substrate that is unoccupied by the solder balls.

An underfill 30 is used to fill the space 28 between the electronic device 14 and the substrate 12, as shown in FIG. 1A. In one example, the underfill 30 is a curable non-conductive silicon dioxide particle filled epoxy that is fluid when applied to the substrate 12 and flows by capillary action. Other types of underfill can be used including those that are solid at room temperature or are frozen. Underfills are typically filled with small particles of glass, for example to provide the desired properties in the cured underfill. When cured and hardened, the underfill forms a strongly bonded, cohesive mass.

Figure 2:
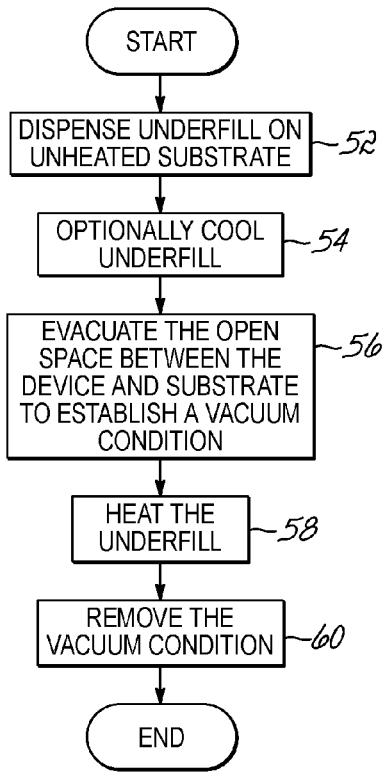
FIG. 2 is a flow chart of a procedure for vacuum underfilling in accordance with an embodiment of the invention.

With reference to FIG. 2, a procedure for vacuum underfilling in accordance with an embodiment of the invention is described. In the FIG. 2 embodiment, a liquid underfill is dispensed onto the substrate. Instead of dispensing the underfill 30 in a liquid form, the underfill 30 could be applied in a solid form in position to buy a pick and place machine, for example, as mentioned above. In block 52, liquid underfill 30 is dispensed onto the substrate 12. The underfill 30 may be applied as one or more continuous lines (FIG. 3A) proximate to one or more exterior edges 18, 20, 22, 24 of the electronic device 14. Preferably, underfill 30 does not touch edges 18, 20, 22, or 24 so that surface 43 is not covered by the underfill 30 until full vacuum is applied. Typically, the dispensed amount of underfill 30 is equal to the volume of the open space 28 under the electronic device 14 plus the fillet 31 (FIG. 1A) that forms along the perimeter of the device 14 after the underfill operation has been completed. The substrate 12 is unheated when the underfill 30 is applied and a gap 42 (FIG. 3A) is preferably present in the underfill 30 so that an air path to the open portion of space 28 through the gap 42 is maintained. As discussed above, the less preferred method is not to leave a gap 42 or open space 43, and to rely on air trapped under the electronic device 14 to bubble through the underfill 30.

The underfill 30 may be applied to the substrate 12 using multiple different types of dispensers and in multiple different ways. For example and although the invention is not so limited, a series of droplets of underfill 30 may be dispensed onto the surface 16 of the substrate 12 from a moving jetting dispenser that is flying above the surface 16.

In block 54, the underfill 30 is cooled when dispensed onto the substrate 12. In one embodiment, the substrate 12 is cooled, for example, by one or more thermoelectric coolers to a temperature below room temperature and the underfill 30 cools shortly after application to approximately the temperature of the substrate 12. Alternatively or in addition to cooling the substrate 12, the underfill 30 may be cooled in the dispenser before being dispensed onto the substrate 12. In one embodiment, the underfill 30 is cooled to a temperature in the range of 0° C. to 10° C. Cooling increases the viscosity of the underfill 30, which further prevents or reduces capillary flow into the open portion of the space 28 between the electronic device 14 and the substrate 12 before vacuum is applied In block 56, the unfilled portion of space 28 is evacuated to a sub-atmospheric pressure through the gap 42 in the underfill 30 or space 43 to establish a vacuum condition (i.e., a pressure less than atmospheric pressure) in space 28. Or, if no gap has been provided, or if the open space 43 is not maintained, the gas will bubble through the underfill 30. To create the vacuum, in one embodiment, the substrate 12, which carries the electronic device 14 and the underfill 30, is moved into a vacuum chamber, sealed inside the chamber, and the vacuum chamber is evacuated to a sub-atmospheric pressure. In one embodiment, a suitable sub-atmospheric pressure for the vacuum is greater than or equal to 25 inches of Hg (about 95 Torr) to 26 inches of Hg (about 100 Torr). In any event, the sub-atmospheric pressure is limited such that the physical properties of the underfill are not significantly or detrimentally modified.

Any suitable technique may be used for moving the substrate 12 into and out of the vacuum chamber, and conventional vacuum systems are familiar to a person having ordinary skill in the art. The substrate 12 is preferably transferred into the vacuum chamber before the occurrence of capillary underfilling (and air or gas entrapment) or before the underfill 30 is allowed to touch any of surfaces 18, 20, 22, 24 thereby maintaining surface 43 be uncovered with underfill 30.

In block 58, after the vacuum chamber is evacuated, and while the vacuum condition is being maintained, the underfill 30 is heated to a temperature in excess of room temperature, for example to a temperature in a range of 30° C. to 120° C. The underfill 30 may be heated by heating the substrate 12, the electronic device 14 or both and in any desired sequence to direct flow. In response to the heating, the underfill 30 flows by capillary action through the narrow gap 27 from each of the exterior edges 18, 20, 22, 24 into the space 28 and around the reflowed solder balls. Because the open portion of the space 28 is evacuated, the underfill 30 can flow across the space 28 such that any void entrapped in the underfill 30 will be evacuated of gases to the vacuum level.

Figure 3C:
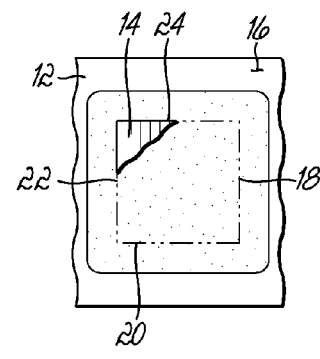

In block 60, after sufficient time has been provided for complete capillary flow to have occurred, then the vacuum condition is removed and atmospheric pressure is restored. For example, the vacuum chamber may be vented to provide the atmospheric pressure condition. Under the influence of atmospheric pressure, any voids present in the underfill 30 will collapse because of their evacuated state of sub-atmospheric pressure and become filled with underfill 30 (FIG. 3C). The substrate 12 is then transferred from the vacuum chamber to a curing oven and the underfill 30 is cured.

Figure 4A:
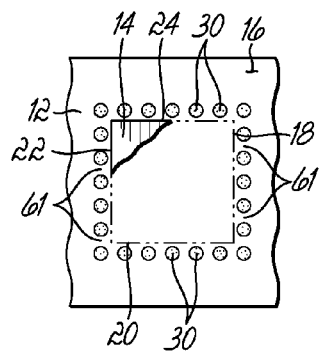
FIGS. 4A-C are diagrammatic top views similar to FIGS. 3A-C in accordance with another embodiment of the invention.
Figure 4B:
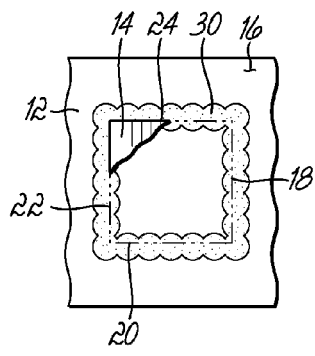
Figure 4C:
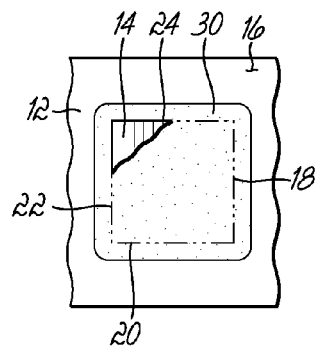
Figure 6A:
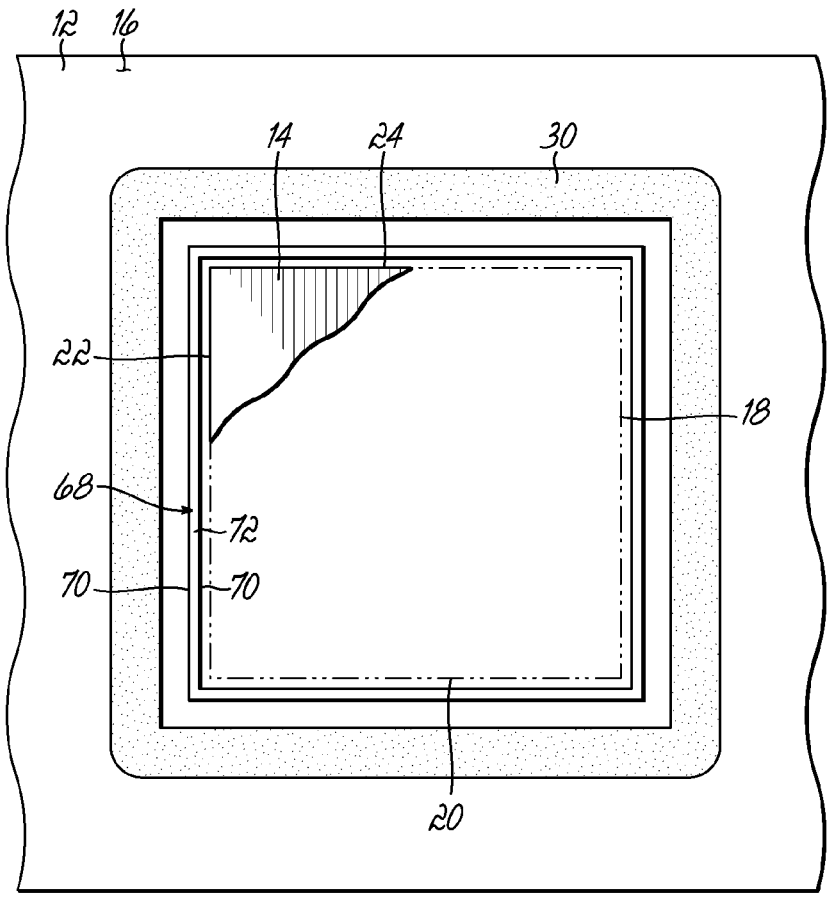
FIG. 6A is a diagrammatic top view similar to FIG. 5A in which a dam is positioned between at least one side edge of the electronic device and the underfill.
Figure 6B:
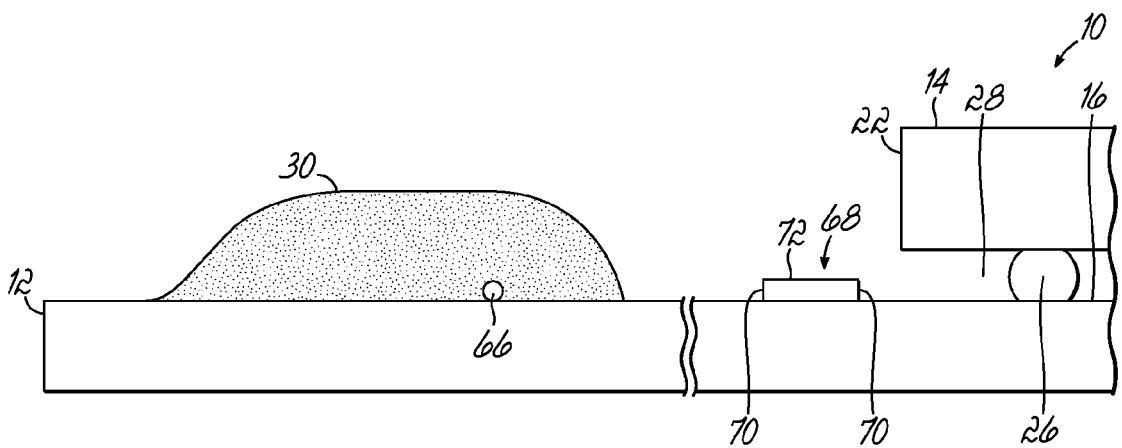
FIG. 6B is a side view of the dam positioned between at least one side edge of the electronic device and the underfill.
Figure 7A:
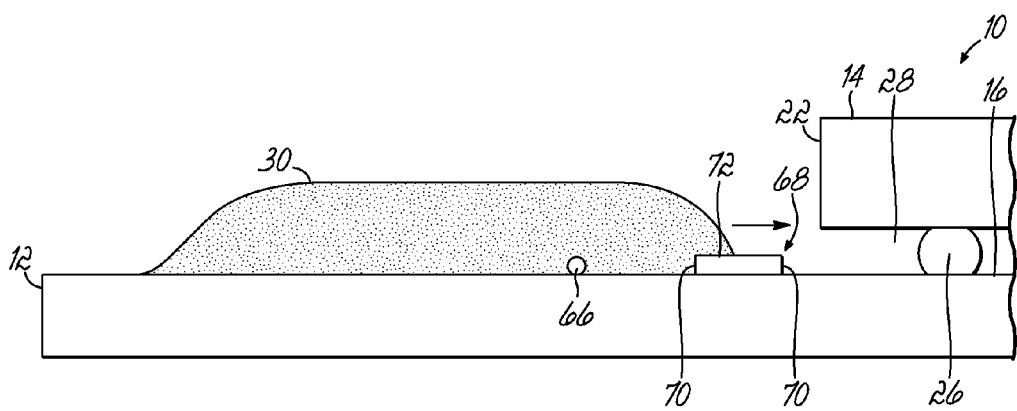
FIGS. 7A and 7B are side views of the underfill flowing over the dam at different time sequences.
Figure 7B:
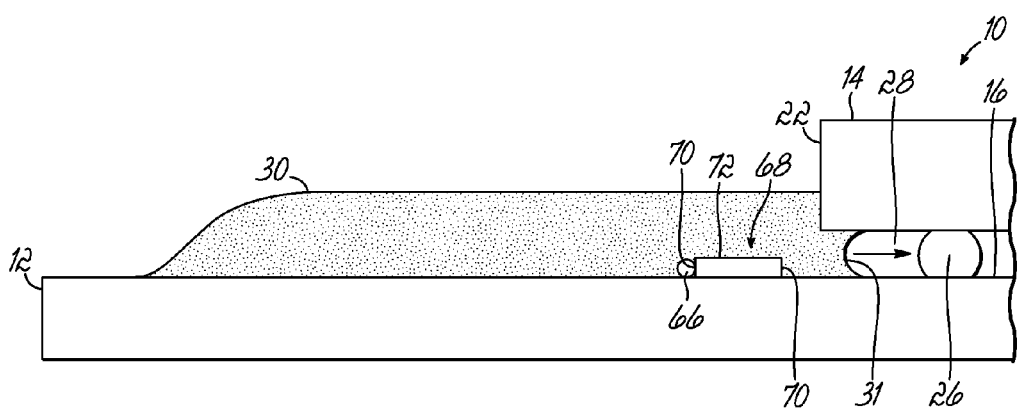
Figure 8A:
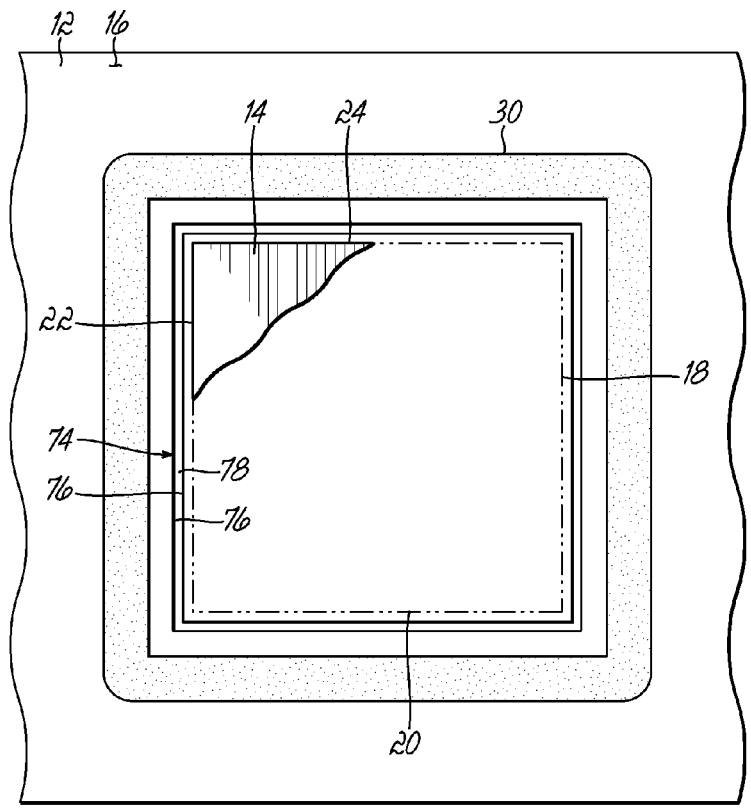
FIG. 8A is a diagrammatic top view similar to FIG. 5A in which a channel is positioned between at least one the side edge of the electronic device and the underfill.
Figure 8B:
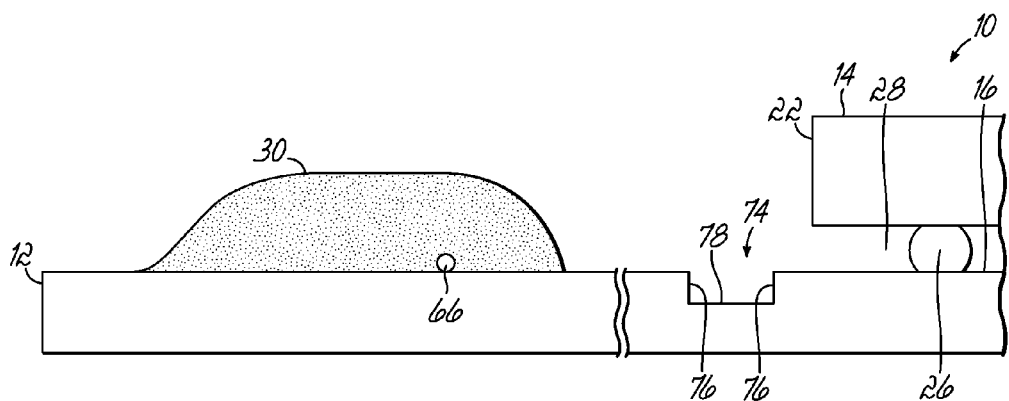
FIG. 8B is a side view of the channel positioned between the side edge of the electronic device and the underfill.

With reference to FIGS. 4A-4C and in alternative embodiments, the underfill 30 may be applied proximate to the exterior edges 18, 20, 22, 24 of the electronic device 14 as a series of disconnected regions (FIG. 4A) with multiple gaps 61. In FIG. 4B, the gaps 61 disappear as the underfill 30 is heated after evacuating the open portion of spaces 28 and 43 to a vacuum condition. In FIG. 4C, the underfill 30 flows beneath the device 14.

With reference to FIGS. 5A-5E and in alternative embodiments, the underfill 30 may be applied proximate to one or more of the exterior edges 18, 20, 22, 24 of the electronic device 14 in one or more passes. In this case, FIG. 5A shows a line of underfill applied along each of the four edges of the device, with a gap 62 and space 43 present at each corner between each pair of exterior edges 18, 20, 22, 24. In FIG. 5B, the underfill 30 is heated after evacuating the space 28 through the gaps 62 to a vacuum condition. In FIG. 5C, the underfill 30, in the heated state, flows beneath the device 14.

In an alternative embodiment and as shown in FIG. 5D, the underfill 30 could be provided as lines using an L pass along exterior edges 18 and 24 of the electronic device 14, preferably providing space 43. In this case, a gap is present along the exterior edges 20 and 22. In another alternative embodiment and as shown in FIG. 5E, the underfill 30 could be provided as lines using a U pass along exterior edges 18, 20, 22 of the electronic device 14 preferably providing space 43, but not along exterior edge 24 of the electronic device 14. In another alternative embodiment and as shown in FIG. 5F, the underfill 30 could be provided as a line using an I pass along exterior edge 20 of the electronic device 14, preferably providing space 43, but not along exterior edges 18, 22, and 24. As probably the least preferred alternative embodiment and as shown in FIG. 5G, the underfill 30 could be applied as lines along all four edges 18, 20, 22 and 24 and in an overlapping manner with no gaps defined at the corners. In this case, the air, or gas, trapped under the electronic device 14 will bubble through the underfill 30 when the vacuum is applied.

The lines of underfill, in addition to being applied in the preferred method from a non-contact jetting valve, such as the DJ 9000 sold by Nordson ASYMTEK of Carlsbad, Calif., could alternatively be applied as solid preforms of epoxy. The solid preforms are placed on the substrate 12 and then melted upon the application of heat. The solid preforms could be placed into position by a pick and place machine or mechanism.

Gas or air 66 can be trapped under the underfill 30 when the underfill is provided on the substrate. Air that is trapped under the underfill 30 when the underfill 30 is applied or laid along the edge of the electronic device 14 may vent underneath the electronic device 14 after the vacuum is applied and the underfill 30 is heated it induce capillary flow. The vented air may become trapped under the electronic device 14 as air pockets, which may lead to the formation of voids in the underfill 30. Ensuring space 43 is maintained until the full vacuum is applied mitigates this trapped air from venting under the electronic device 14.

In accordance with alternative embodiments of the invention, the substrate 12 may include an obstacle positioned on the surface 16 proximate to at least one exterior edge 18, 20, 22, 24 of the electronic device 14. In a representative embodiment, the obstacle may be formed as a linear body. The obstacle is located between the location of the dispensed underfill 30 and the adjacent exterior edge 18, 20, 22, 24 of the electronic device 14.

The obstacle serves as an impediment over which the underfill 30 must flow before flowing toward the exterior edge 18, 20, 22, 24 of the electronic device 14 and into the open portion of the space 28, during the procedure for vacuum underfilling shown in FIG. 2 thereby maintaining space 43. The liquid underfill 30 (or a majority thereof) is able to flow over the obstacle, and the obstacle has only a negligible or minor effect on the flow and flow rate of the underfill liquid. However, air or gas pockets are generally incapable of surmounting the obstacle or are vented as the underfill 30 flows over space 43 before reaching the gap 27. As such, the obstacle removes air or gas pockets from the underfill. Therefore, this embodiment helps reduce or eliminate trapped gas under the electronic device 14 during the vacuum-assisted underfilling operation.

As the distance between the dispensed underfill 30 and the exterior edge 18, 20, 22, 24 of the electronic device 14 increases, the ability of trapped gas 66 under the underfill 30 to reach the gap 27 decreases. If air 66 is trapped under the underfill 30 and the underfill 30 is laid adjacent to the exterior edges 18, 20, 22, 24 of the electronic device 14 (i.e., in contact with the electronic device 14), the air 66 trapped under the underfill 30 may be vented under the electronic device 14 when the vacuum is applied and the underfill 30 is heated. Air that vents under the electronic device 14 may become trapped under the electronic device 14. Therefore, the underfill 30 should be positioned on the substrate 12 far enough away from the exterior edge 18, 20, 22, 24 of the electronic device 14 so as to avoid venting under the electronic device 14. When the underfill 30 is positioned far away from the exterior edge 18, 20, 22, 24 of the electronic device 14, the substrate 12 may be tilted so as to help induce the underfill 30 to flow toward the exterior edge 18, 20, 22, 24 and under the electronic device 14 when the underfill 30 is heated. The overall purpose is to prevent air 66 trapped under the underfill 30 from venting under the electronic device 14, with the underfill 30 then flowing around the air so as to form a bubble under the electronic device 14. The use of the obstacle, as in the present embodiment, effectively achieves the same result, as the underfill 30 is spaced apart from the exterior edges 18, 20, 22, 24 of the electronic device 14 by a distance required for the placement of the obstacle.

With reference to FIGS. 6A-7B in which like reference numerals refer to like features in FIGS. 1-5G and in accordance with an alternative embodiment, the obstacle may be a dam 68 formed on the surface 16 of the substrate 12. The dam 68 may have a top wall 72 raised above the surface 16 of the substrate 12 and side walls 70 ascending from the surface 16 to the top wall 72. As discussed above, the surface 16 receives the dispensed underfill 30. Consequently, the dam 68 is located on the same surface 16 that receives the dispensed underfill 30 and on which the electronic device 14 is mounted and between underfill 30 and the exterior edges of 18, 20, 22, 24. A height of the dam 68 is sufficiently low so that the underfill 30 may flow over the dam 68 when the assembly 10 is heated to a given temperature. The height of the dam 68 is low enough not to impede the underfill flow after heating. Although the underfill 30 may flow over the dam 68, the air 66 is unable to surmount the wall 70 or the air vents through the underfill as it flows over space 32 toward external edges 18, 20, 22, 24 and, therefore, the air does not flow under the electronic device 14.

The dam 68 may be formed of a legend ink, such as that which is typically used on PC boards for visible markings or letters. Alternatively, a damming material such as that which is typically used for dam and fill operations could be employed. More generally, the damming material could be any thixotropic material, meaning any material that does not flow once it is deposited on the surface 16 of the substrate 12.

Although the side walls 70 and the top wall 72 of the dam 68 form two right angles in the representative embodiment, the side walls 70 and/or the top wall 72 may be inclined, contoured, and/or curved. Alternatively, the two side walls 70 may converge at an angle, such that the top of the dam 68 forms a peak or a crest rather than a wall that is parallel to the surface 16 of the substrate 12. Moreover, a width of the dam 68, including the dimensions of the side walls 70 or the top wall 72, may vary.

Figure 9A:
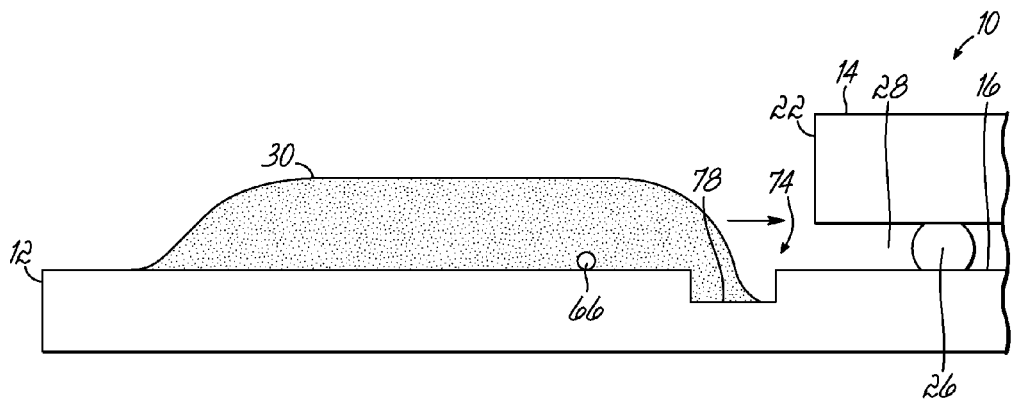
FIGS. 9A and 9B are side views of the underfill flowing over the channel at different time sequences.
Figure 9B:
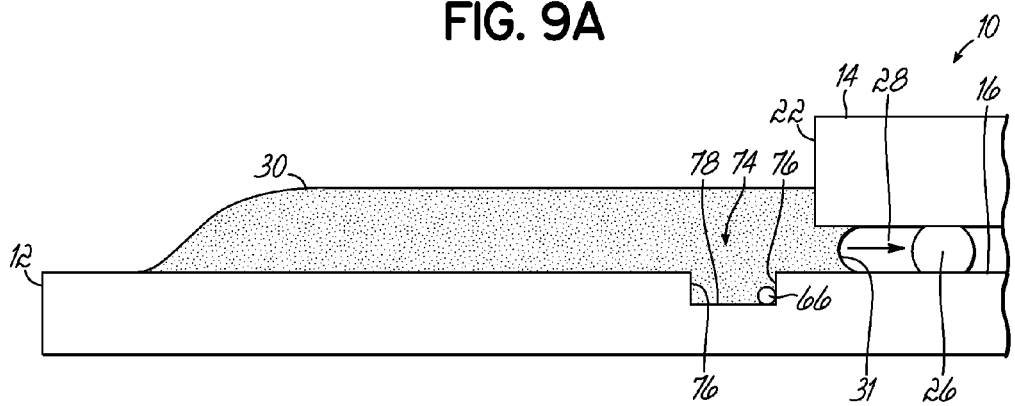

With reference to FIGS. 8A-9B in which like reference numerals refer to like features in FIGS. 6A-7B and in accordance with an alternative embodiment, the obstacle may be a channel 74 formed in the substrate 12 and recessed below the surface 16 of the substrate 12. The channel 74 may be formed by a router, for example. As discussed above, the surface 16 receives the dispensed underfill 30. Consequently, the channel 74 is located on the same surface 16 that receives the dispensed underfill 30 and on which the electronic device 14 is mounted. The channel 74 may have a base 78 positioned at a distance below a level of the surface 16 and side walls 76 descending from the surface 16 to the base 78. The channel 74 may obstruct or impede the underfill 30 from flowing to external edges 18, 20, 22, 24, prior to heating the underfill. As shown in FIGS. 9A and 9B, after vacuum is applied and the underfill 30 is heated, the underfill 30 flows into and/or over the channel 74 before flowing toward the at least one exterior edge 18, 20, 22, 24 of the electronic device 14 and into the open portion of the space 28. However, the air 66 trapped under the underfill 30 is trapped in the channel 64; once the air 66 flows into the channel 64, it is unable to surmount the sidewalls 76. Any remaining air vents through the underfill 30 before the underfill 30 reaches the gap 27. In this way, the channel 74 helps to prevent the air 66 from flowing under the electronic device 14. The depth of the channel 74 should be sufficiently shallow so that substantially all of the liquid underfill 30 may flow through or over the channel 74. However, the depth of the channel 74, and thus the heights of the side walls 76, may vary.

Although the side walls 76 and the base 78 of the channel 74 form two right angles in the representative embodiment, the walls 76 and/or base 78 may be inclined, contoured, and/or curved. Alternatively, the two side walls 76 may converge at an angle, such that the channel 74 lacks a planar base. Moreover, a width of the channel 74, including the dimensions of the side walls 76 or the base 78, may vary.

In an alternative embodiment, the obstacle may include combined features of the dam 68 and the channel 74. For example, the dam 68 may be immediately followed by the channel 74 on the substrate 12, such that the underfill 30 flows over the dam 68 and through the channel 74 before flowing toward the exterior edge 18, 20, 22, 24 of the electronic device 14.

In the representative embodiment, a single obstacle is shown extending around an entire periphery of the electronic device 14. However, in alternative embodiments, one or more obstacles may extend along any combination of the one or more exterior edges 18, 20, 22, 24. Moreover, the obstacles may be longer or shorter than the lengths of the one or more exterior edges 18, 20, 22, 24. Preferably, a positioning of the one or more obstacles will correspond to the positioning of the dispensed underfill 30, such that all of the underfill 30 must flow over the obstacles in order to reach the exterior edges 18, 20, 22, 24 of the electronic device 14.

Figure 10:
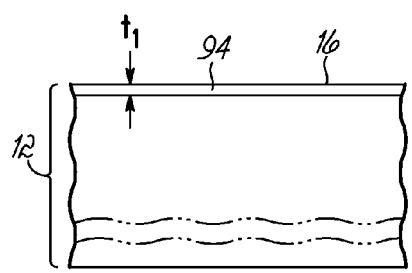
FIG. 10 is a cross-sectional view of a plasma-treated substrate according to an embodiment of the invention.
Figure 11:
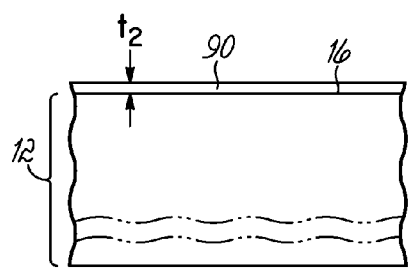
FIG. 11 is a cross-sectional view of a plasma-treated substrate according to another embodiment of the invention.

With reference to FIGS. 10 and 11 and in accordance with an alternative embodiment, the surface 16 of the substrate 12 having an original composition and wettability may be modified to mitigate the trapping of air under the underfill 30 is originally dispensed. In this embodiment, the substrate 12 may be plasma treated so as to change the wettability of the surface on which the underfill 30 is dispensed. The plasma treatment process may be activated by methods known to those of ordinary skill.

With particular reference to FIG. 10, the substrate 12 may also be plasma treated so as to activate a surface layer 94 of the substrate 12. Such activation may alter a chemical composition, and, thus, physical characteristics of the surface layer 94 of the substrate 12 so as to change its wettability. The surface layer 94 of the substrate 12 has a thickness $t_1$. The plasma activation does not add a layer to the substrate 12; rather, it modifies the layer 94 with thickness t1 of the preexisting substrate 12.

In an embodiment, the plasma treatment decreases the wettability of the layer 94 of the substrate 12. By rendering the surface layer 94 of the substrate 12 less wettable, less air may be trapped and air that is trapped under the underfill 30, when the underfill 30 is positioned on the substrate 12, may more easily escape from beneath the underfill 30 when the vacuum is applied. The surface layer 94 with decreased wettability may have more surface imperfections through which the air may escape than the original surface 16 of the substrate 14. In this way, the trapping of air under the electronic device 14 during the vacuum-assisted underfill operation may be reduced by the reduction of trapped air 66 under the underfill 30.

In another embodiment, the plasma treatment increases the wettability of the layer 94 of the substrate 12. Less air is entrapped under underfill 30 deposited on the plasma-treated surface having an increased wettability than on a non-plasma treated surface because air may be more easily displaced as the underfill 30 is applied. By reducing the initial trapping of air under the underfill 30, the trapping of air under the electronic device 14 during the vacuum-assisted underfill operation may also be reduced.

With particular reference to FIG. 11, plasma deposition may be used to deposit a very thin, glass-like layer 90 or film on the surface 16 of the substrate 12. The layer 90 has a thickness t2, and, thus, a height of the plasma-treated substrate is increased (as compared to a height of the original substrate 12) by height $t_2$. The plasma-treated surface may be so smooth and flat that there are fewer surface imperfections, such as depressions, in which air can be trapped. As such, conducting vacuum-assisted underfilling on the plasma deposited layer 90 helps prevent air or gas from being trapped under the underfill 30. By reducing the initial trapping of air under the underfill 30, the trapping of air under the electronic device 14 during the vacuum-assisted underfill operation may also be reduced. In an embodiment, a combined plasma treatment method may be employed, in which the glass-like layer 90 is deposited on the substrate 12 and then is activated so as to further increase wettability.

Figure 12:
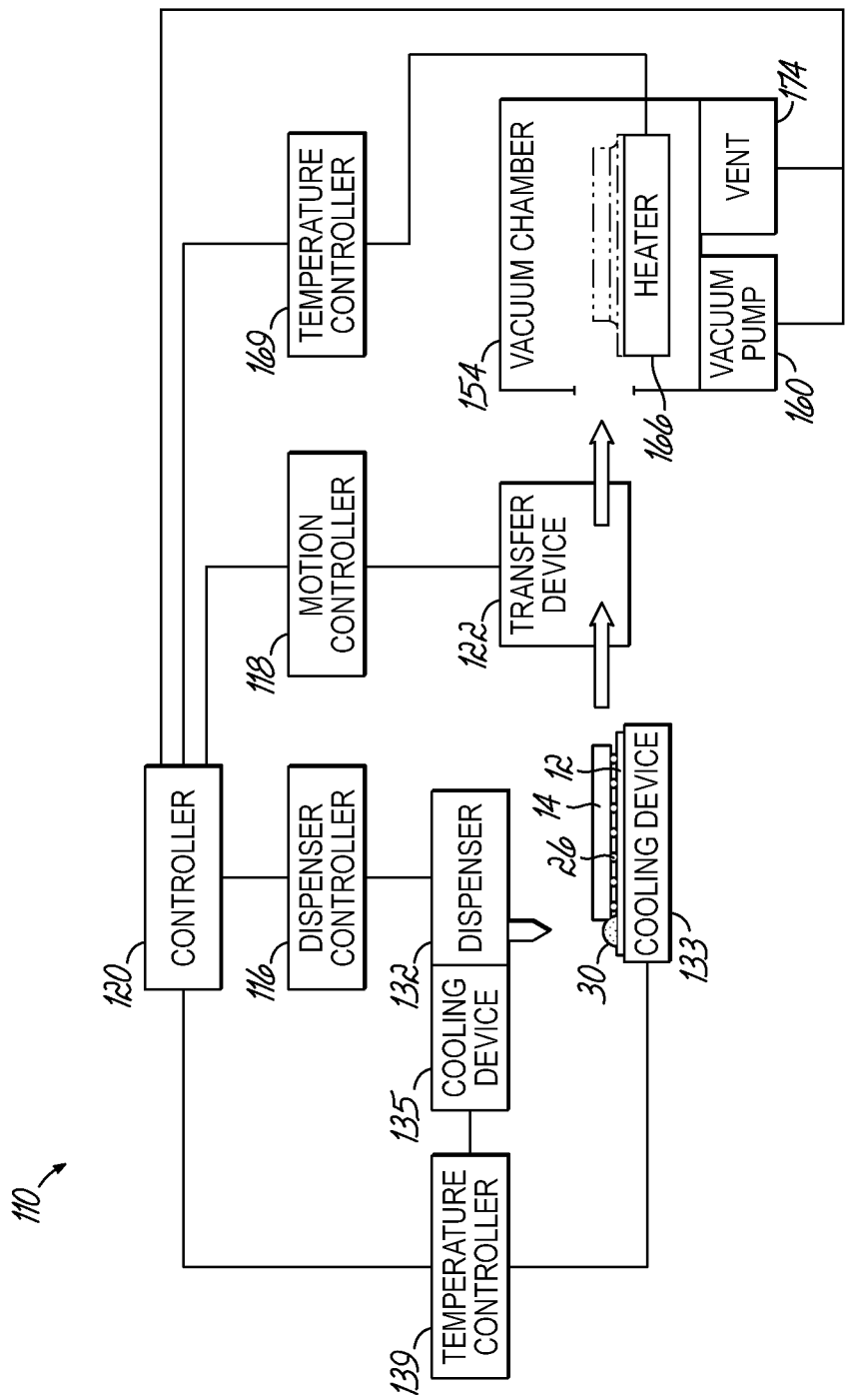
FIG. 12 is a schematic representation of a vacuum underfilling system in accordance with an embodiment of the invention.

In an embodiment, a combination of the methods provided above may be employed to help prevent the entrapment of air bubbles under the electronic device 14. For example, the top surface 16 of the substrate 12 may be plasma treated so as to increase the wettability of the top surface 16 and/or to deposit a glass-like layer 90 on the substrate 12. Such plasma treatment will help prevent air from being trapped under the underfill 30 when it is provided on the substrate 12. In addition, an obstacle, such as a dam 68 or a channel 74, may be provided on the plasma-treated substrate 12 so as to block any air 66 that may have been trapped under the underfill 30 from flowing under the electronic device 14 during the vacuum-assisted underfill operation or to prevent the underfill 30 from flowing over space 43 prior to heating the underfill 30 in the vacuum With reference to FIG. 12, a system 110 for use in vacuum underfilling is configured to dispense amounts of the underfill 30 on the substrate 12 upon which the electronic device 14 is mounted by reflowed solder balls, or another interconnect technology, and is separated from the substrate 12 by the space 28. The space 28 has an open portion that is not occupied by the conductive joints 26, which in this case are in the form of reflowed solder balls.

A controller 120, which is electrically coupled with a motion controller 118 and a dispenser controller 116, coordinates the overall control for the system 110. Each of the controllers 116, 118, 120 may include a programmable logic controller (PLC), a digital signal processor (DSP), or another microprocessor-based controller with a central processing unit capable of executing software stored in a memory and carrying out the functions described herein, as will be understood by those of ordinary skill in the art.

The system 110 preferably includes a cooling device 133 and a cooling device 135 that is coupled with the dispenser 132. The cooling device 133 is configured to cool the substrate 12 such that the underfill 30 cools when dispensed onto the substrate 12. The cooling device 135 is configured to cool the underfill 30 such that the underfill 30 is cooled before dispensing onto the substrate 12. The cooling devices 133, 135 are preferred, and optional, and may be respectively operated by a temperature controller 139 under the control of controller 120 to reduce the temperature of the substrate 12 to below room temperature and/or to reduce the temperature of a portion of the dispenser 132 to below room temperature.

The system 110 includes a dispenser 132, which may be a jetting dispenser, used to dispense the amounts of the underfill. Downstream from the dispenser 132, the system 110 further includes a vacuum chamber 154 configured to permit access for inserting and removing each assembly 10 and configured to provide a sealed condition in which an interior space of the vacuum chamber 154 is isolated from the surrounding atmospheric-pressure environment. A vacuum pump 160 is coupled with the interior space of the vacuum chamber and is configured to evacuate the interior space as operated by the controller 120. A vent 174 is used under the control of the controller 120 to admit gas to the interior space to raise the chamber pressure. The controller 120 supplies motion instructions to the motion controller 118 to operate a transfer device 122 used to move the substrate 12, which is carrying the underfill 30, into the vacuum chamber 154.

A heater 166 is disposed inside the vacuum chamber 154 and is configured to be powered by a temperature controller 169 linked with the controller 120. Heat is transferred from the heater 166 to each substrate 12. In one embodiment, the temperature of the substrate 12 and underfill on the substrate ranges from 30° C. to 120° C.

In use, the substrate 10 is moved to a location beneath the dispenser 132 and underfill is dispensed or otherwise applied. In the representative embodiment, the controller 120 sends commands to the motion controller 118 to cause the transfer device 122 to move the dispenser 32 and the controller 120 sends commands to the dispenser controller 116 to cause the dispenser 32 to dispense the underfill in one or more lines around the exterior edges 18, 20, 22, 24 of the electronic device 14. The substrate 12 is not heated during the dispensing operation. Preferably, at least one gap is left in the one or more lines of underfill 32 and preferably the underfill 30 is not in contact with the exterior edge 18, 20, 22 24. For a jetting dispenser 132, the dispenser controller 16 triggers the jetting of droplets at appropriate times during the movement such that the droplets will impact at a desired location on the substrate 12. Each dispensed droplet contains a small volume of the underfill, which is typically controlled with high precision by the dispenser controller 16.

In one embodiment, the cooling device 133 may be used to cool the substrate 12 so that the underfill 30 cools to a temperature below room temperature upon contact with the substrate 12. Alternatively, the cooling device 135 coupled with the dispenser 132 may be used to cool the underfill 30 before dispensing.

After the dispensing operation is completed and before significant capillary underfilling (and air or gas entrapment) occurs, the controller 120 sends commands to the motion controller 118 to cause the transfer device 122 to transport the assembly 10 and dispensed underfill 30 on the substrate 12 into the vacuum chamber 54. Once the assembly 10 and dispensed underfill 30 on the substrate 12 are isolated inside the vacuum chamber 54 from the ambient environment, the controller 120 causes the vacuum pump 160 to evacuate the interior space inside the vacuum chamber 154. While the vacuum is being applied, each gap allows a vacuum condition (i.e., a pressure less than atmospheric pressure) to be established under the electronic device 14 between the electronic device 14 and the substrate 12 or, if there is no gap, then the gas bubbles through the underfill to create a vacuum condition under the electronic device 14.

When a suitable vacuum pressure exists inside the vacuum chamber 154 and with the vacuum condition being maintained, the controller 120 causes the temperature controller 169 to operate the heater 166, which heats the substrate 12, electronic device 14, and the underfill 30. The elevated temperature encourages the underfill 30 to flow over the substrate space 43 and into the open portion of the space beneath the electronic device 14. The underfill 30 completely flows under the electronic device 14 and into the spaces between the reflowed solder balls. Underfilling in the presence of the vacuum condition means any void entrapped in the underfill will be partially evacuated of gases. After flow ends, the controller 120 sends commands to the motion controller 118 to cause the vent 174 to admit gas to the vacuum chamber 154 so that the pressure inside the vacuum chamber 154 is returned to atmospheric pressure. Any voids present in the underfill 30 collapse because of the evacuated condition and become filled with underfill 30. The substrate 12 with the underfilled electronic device 14 is transferred out of the vacuum chamber 154 to, for example, a curing oven (not shown).

While the invention has been illustrated by the description of one or more embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of Applicant's general inventive concept.

What is claimed is:

1. A method of providing an underfill on a substrate upon which an electronic device is mounted by electrically conductive joints and is separated from the substrate by a space, the space having an open portion that is unoccupied by the conductive joints, the method comprising:
   providing the underfill on the substrate at a location along an exterior edge of the electronic device;
   evacuating the space to provide a vacuum condition in the open portion of the space;
   after evacuating the space to provide the vacuum condition, heating the underfill to cause flow of the underfill toward the exterior edge of the electronic device and into the open portion of the space; and
   while the space is evacuated, removing trapped gas under and from the underfill by flowing the underfill across an obstacle positioned between the location on the substrate at which the underfill is provided and the exterior edge of the electronic device.

2. The method of claim 1, wherein the obstacle is a dam raised above a surface of the substrate on which the underfill is provided and to which the electronic device is mounted.

3. The method of claim 1, wherein the obstacle is a channel recessed below a surface of the substrate on which the underfill is provided and to which the electronic device is mounted.

4. The method of claim 1, wherein the obstacle extends substantially a length of the exterior edge of the electronic device.

5. The method of claim 1, wherein providing the underfill on the substrate further comprises:
   dispensing the underfill onto the substrate.

6. The method of claim 1, wherein providing the underfill on the substrate further comprises:
   placing a solid underfill onto the substrate.

* * * * *